(12) United States Patent  (10) Patent No.: US 7,445,111 B2
Kitazumi et al.  (45) Date of Patent: Nov. 4, 2008

(54) TRANSPORT SYSTEM INCLUDING VERTICAL ROLLERS

(75) Inventors: Barry Kitazumi, Milpitas, CA (US); Michael D. Brain, Monte Sereno, CA (US); Mihir Parikh, Los Altos Hills, CA (US)

(73) Assignee: Aquest Systems Corporation, Sunnyvale, CA (US)

( * ) Notice: Subject to any disclaimer, the term of this patent is extended or adjusted under 35 U.S.C. 154(b) by 0 days.

(21) Appl. No.: 11/764,161

(22) Filed: Jun. 15, 2007

(65) Prior Publication Data

US 2007/0240971 A1 Oct. 18, 2007

Related U.S. Application Data

(63) Continuation of application No. 11/406,569, filed on Apr. 18, 2006, now Pat. No. 7,281,623.

(51) Int. Cl.
*B65G 15/50* (2006.01)
(52) U.S. Cl. .............. 198/799; 198/461.1; 198/626.2; 198/761; 198/799; 414/940
(58) Field of Classification Search ........... 198/799, 198/784, 940, 626.2, 809, 468.8, 370.04, 198/461.1, 377.1, 475.1, 761
See application file for complete search history.

(56) References Cited

U.S. PATENT DOCUMENTS

| | | |
|---|---|---|
| 2,297,296 A | 9/1942 | Flintjer |
| 3,105,334 A | 10/1963 | Marshall |
| 3,380,459 A | 4/1968 | Schmermund |
| 3,570,684 A | 3/1971 | Cowan |
| 3,931,881 A | 1/1976 | Bickel et al. |
| 3,951,257 A | 4/1976 | Storace et al. |
| 3,976,202 A | 8/1976 | Bauvin |
| 4,015,722 A * | 4/1977 | Cooper et al. ............ 414/788.2 |
| 4,217,977 A | 8/1980 | Tam |
| 4,300,937 A * | 11/1981 | Rhonehouse ................. 65/114 |
| 4,479,572 A | 10/1984 | Merz |

(Continued)

FOREIGN PATENT DOCUMENTS

EP 0 466 278 A1 1/1992

(Continued)

OTHER PUBLICATIONS

"Supertrak Modular Conveyor System," ATS Automation Tooling Systems, Inc., Canada, located at http://www.atsautomation.com/automation/automationtech/st_supertrak.asp.

(Continued)

*Primary Examiner*—Gene O. Crawford
*Assistant Examiner*—Kavel P Singh
(74) *Attorney, Agent, or Firm*—Carr & Ferrell LLP

(57) ABSTRACT

A transport system for conveying articles along conveyance paths including straight, curvilinear, horizontal, inclined and declined conveyance sections. The articles are conveyed between a pair of vertical belts while being supported by protrusions extending from the vertical belts. The vertical belts are guided using a multiplicity of vertical rollers that are configurable into straight, curvilinear and dynamically changing conveyance sections. Multiple conveyance sections can be joined end to end to transport articles over complex paths and over long distances. The articles conveyed may include semiconductor wafers.

36 Claims, 11 Drawing Sheets

U.S. PATENT DOCUMENTS

| | | | |
|---|---|---|---|
| 4,589,541 A | 5/1986 | Lisec | |
| 4,662,510 A | 5/1987 | Oakley et al. | |
| 4,779,715 A | 10/1988 | Pazdernik | |
| 4,817,781 A | 4/1989 | Folk | |
| 4,865,182 A | 9/1989 | Nolte | |
| 4,874,081 A | 10/1989 | Kondo | |
| 5,029,696 A | 7/1991 | Van Tilburg | |
| 5,090,557 A | 2/1992 | Carmen | |
| 5,145,055 A | 9/1992 | Kondo | |
| 5,492,216 A * | 2/1996 | McCoy et al. | 198/626.5 |
| 5,670,230 A * | 9/1997 | Schlueter Jr. et al. | 428/57 |
| 5,839,566 A * | 11/1998 | Bonnet | 198/370.04 |
| 5,884,753 A | 3/1999 | Robertson | |
| 5,915,525 A | 6/1999 | Baker et al. | |
| 5,951,016 A | 9/1999 | Bateman | |
| 5,967,398 A | 10/1999 | Fritz, Sr. | |
| 6,044,959 A | 4/2000 | Monsees | |
| 6,082,526 A | 7/2000 | Baker et al. | |
| 6,170,733 B1 | 1/2001 | Fritz, Sr. | |
| 6,223,886 B1 | 5/2001 | Bonora et al. | |
| 6,253,908 B1 * | 7/2001 | Gilman | 198/769 |
| 6,280,134 B1 | 8/2001 | Nering | |
| 6,308,818 B1 | 10/2001 | Bonora et al. | |
| RE37,471 E | 12/2001 | Jagger | |
| 6,378,689 B1 | 4/2002 | Wellpott | |
| 6,382,399 B2 * | 5/2002 | Simkowski | 198/626.1 |
| 6,390,282 B1 | 5/2002 | Ouellette | |
| 6,422,378 B1 * | 7/2002 | Allgaier | 198/781.03 |
| 6,460,690 B1 | 10/2002 | Tachibana et al. | |
| 6,494,308 B2 * | 12/2002 | Bonora et al. | 198/465.2 |
| 6,510,939 B2 | 1/2003 | Gamberini | |
| 6,533,101 B2 | 3/2003 | Bonora et al. | |
| 6,533,104 B1 | 3/2003 | Starlinger-Huemer | |
| 6,726,201 B2 | 4/2004 | Studer | |
| 6,761,264 B2 | 7/2004 | Steeber et al. | |
| 6,786,326 B2 | 9/2004 | Hiramoto et al. | |
| 6,848,882 B2 | 2/2005 | Chen | |
| 6,889,817 B2 | 5/2005 | Leisner | |
| 6,899,220 B2 | 5/2005 | Saeki | |
| 6,974,022 B2 | 12/2005 | Saeki | |
| 6,986,419 B2 * | 1/2006 | Nishikita | 198/847 |
| 7,004,310 B2 | 2/2006 | Axmann | |
| 7,025,191 B2 * | 4/2006 | Lichti et al. | 198/347.1 |
| 7,281,623 B1 | 10/2007 | Kitazumi et al. | |
| 2002/0119036 A1 | 8/2002 | Huber | |
| 2002/0195316 A1 * | 12/2002 | Bertuzzi et al. | 198/457.01 |
| 2006/0257233 A1 | 11/2006 | Bonora | |

FOREIGN PATENT DOCUMENTS

| | | |
|---|---|---|
| EP | 0 486 868 A1 | 5/1992 |
| EP | 0 549 833 A1 | 7/1993 |
| FR | 2 683 213 A1 | 5/1993 |
| GB | 2211810 A | 12/1989 |

OTHER PUBLICATIONS

U.S. Appl. No. 11/897,024, Barry Kitazumi, High Speed Transporter Including Horizontal Belt, filed Aug. 27, 2007.

U.S. Appl. No. 11/764,755, Barry Kitazumi, Conveyor System Including Offset Section, filed Jun. 18, 2007.

U.S. Appl. No. 11/897,013, Michael D. Brain, Conveyor Transfer System, filed Aug. 27, 2007.

U.S. Appl. No. 12/002,850, Michael D. Brain, High Capacity Delivery with priority Handling, filed Dec. 18, 2007.

U.S. Appl. No. 11/818,657, Barry Kitazumi, Systems and Methods for Transport Through Curves, filed Jun. 14, 2007.

U.S. Appl. No. 11/900,482, Barry Kitazumi, Systems and Methods for Transport Through Curved Conveyance Sections, filed Sep. 11, 2007.

U.S. Appl. No. 11/983,353, Barry Kitazumi, Integrated Overhead Transport System with Stationary Drive, filed Nov. 7, 2007.

* cited by examiner

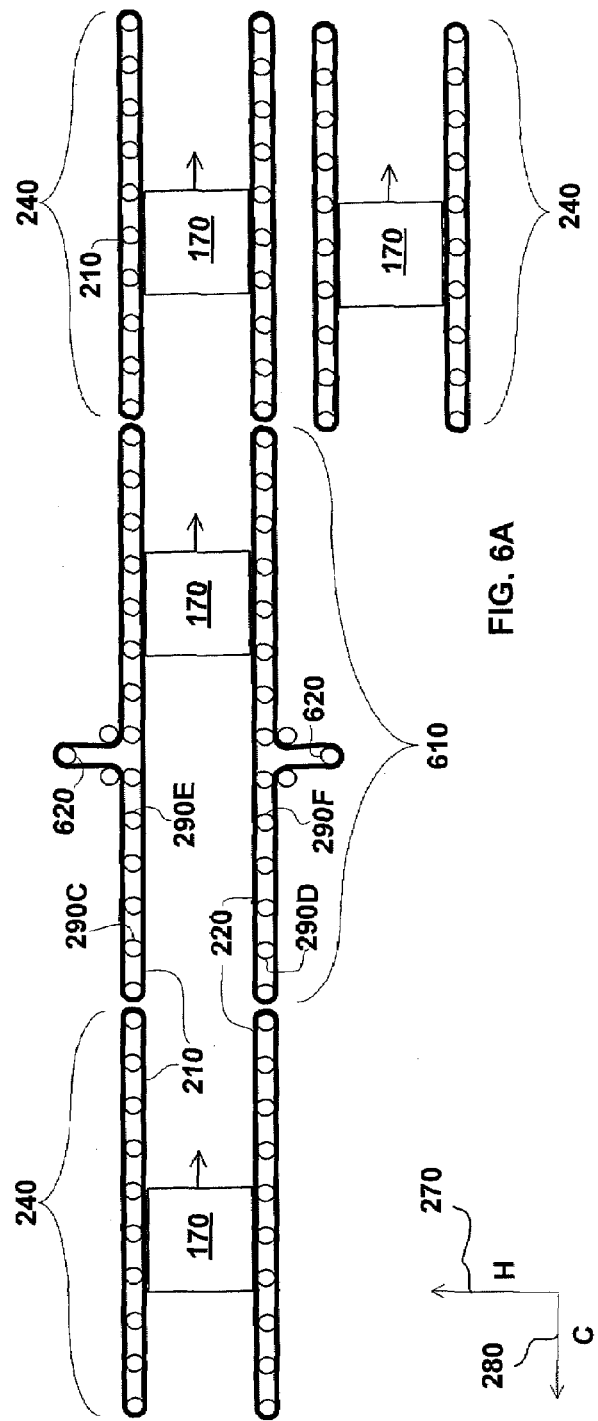
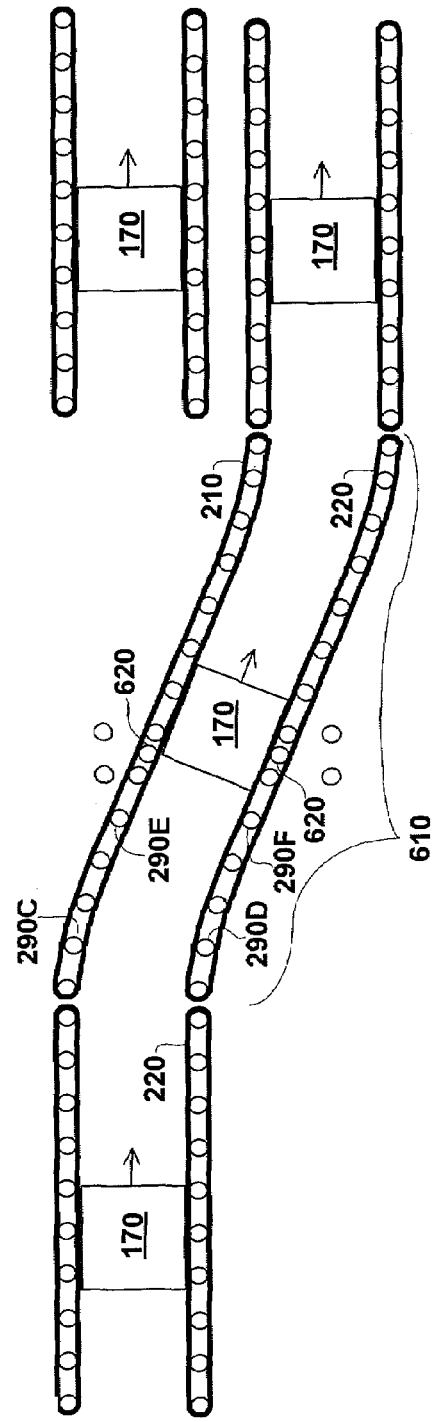
FIG. 6A
FIG. 6B

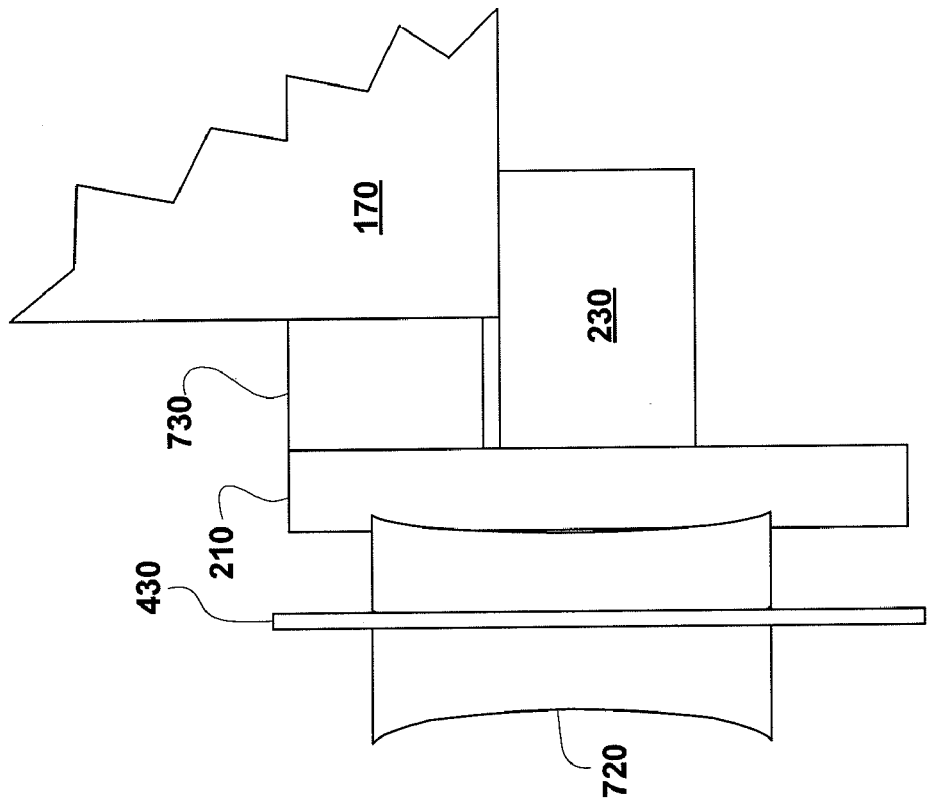
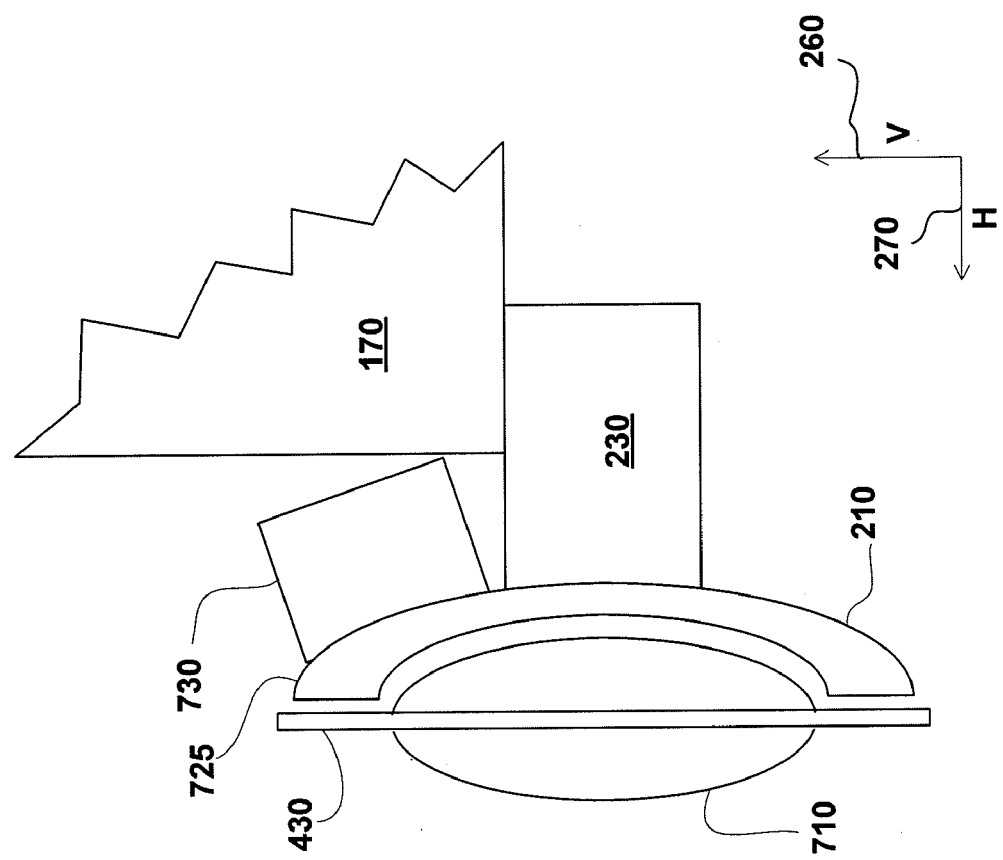
FIG. 7B
FIG. 7A

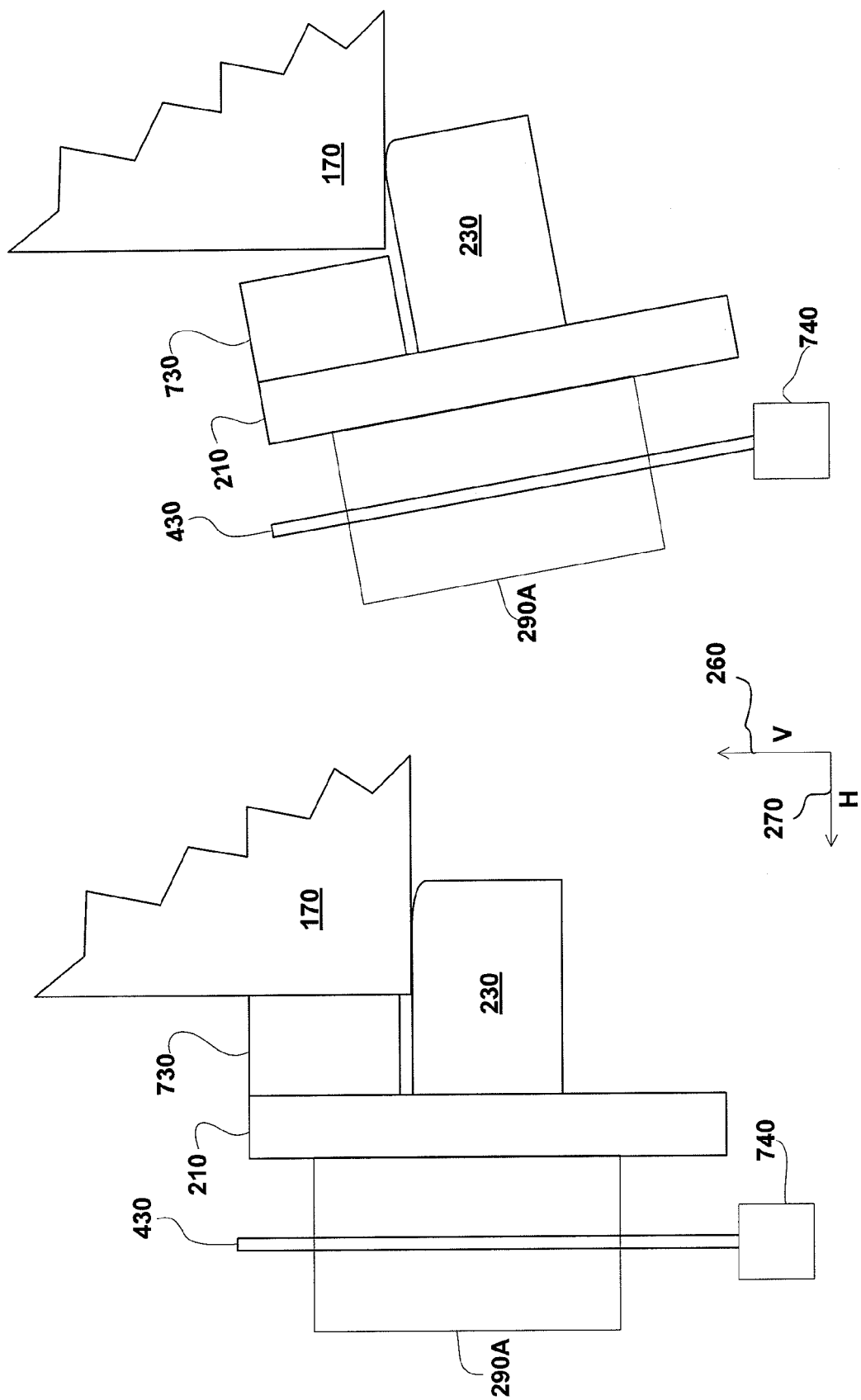

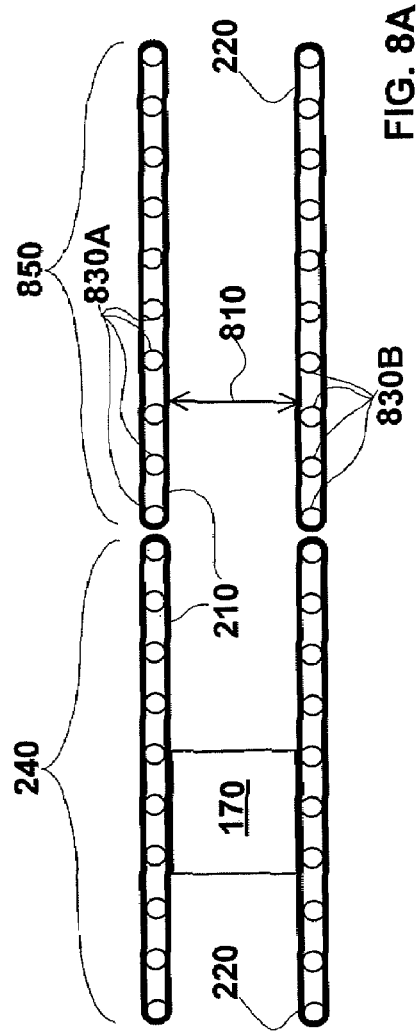
FIG. 8A
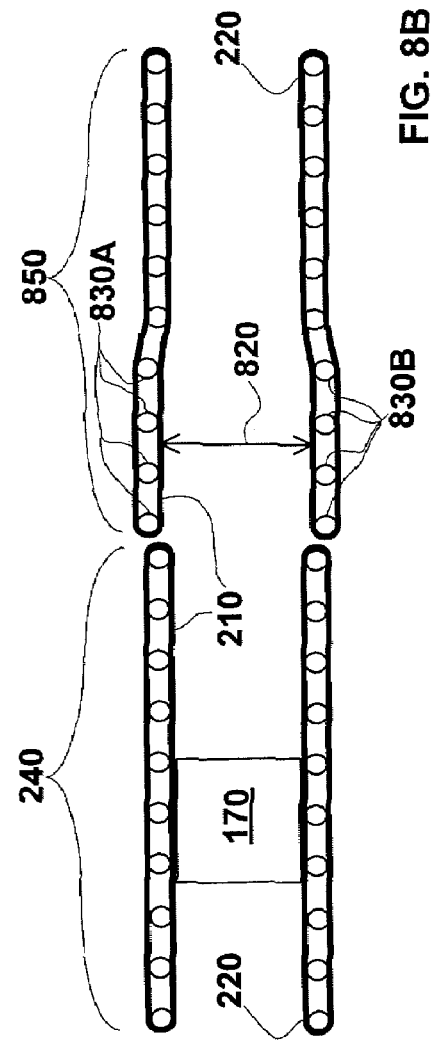
FIG. 8B
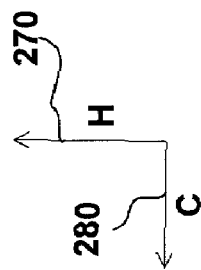

TRANSPORT SYSTEM INCLUDING VERTICAL ROLLERS

CROSS-REFERENCE TO RELATED APPLICATIONS

This application is a continuation of U.S. patent application Ser. No. 11/406,569 filed Apr. 18, 2006 now U.S. Pat. No. 7,281,623, and entitled "Transport System Including Vertical Rollers." The Disclosure of the above patent application is hereby incorporated herein by reference.

BACKGROUND OF THE INVENTION

1. Field of the Invention

The current invention relates to transport systems and methods for conveying articles along a conveyance path, and in some embodiments to conveying semiconductor wafers in a semiconductor fabrication facility.

2. Related Art

Transport systems are widely employed in industrial manufacturing facilities to convey articles between work stations. Originally, these systems were manual and workers moved articles by hand or by cart. Modern factories have developed specialized equipment to convey articles automatically. In particular, semiconductor fabrication facilities currently use automated transport systems to move semiconductor wafers during the manufacturing process. Typically, a batch of wafers may be conveyed together in a container known as a Front Opening Unified Pod (FOUP). Semiconductor wafer manufacturers have sought to increase manufacturing productivity by using transport systems that efficiently convey wafers from machine to machine without exposing the wafers to excessive contamination, vibration or to excessive acceleration and deceleration forces.

Existing transport systems employ vehicle-based devices to eliminate vibrations but the capacity of this system is limited by the number of vehicles available. To resolve this, transporters are used in which articles are, for example, directly conveyed across the horizontal surface of a transport belt on rollers, or directly on the rollers. One such transport system is shown in FIG. 1A. A common feature of these existing systems is the difficulty of vibrationally isolating the article being conveyed from the surface across which the articles travel. If the surface across which the articles travel is not flat, the articles experience vibration during the conveyance. This source of vibration is a known problem in the semiconductor wafer manufacturing industry. For example, as shown in FIG. 1A, Horizontal Rollers 110 include Circular Surfaces 120 on which a Horizontal Belt 130 rests. Horizontal Belt 130 may be characterized by a Length 140, a Long Cross-Sectional Axis 150, and a Short Cross-Sectional Axis 160. The Long Cross-Sectional Axis 150 and a Short Cross-Sectional Axis 160 are perpendicular to the length, and disposed in horizontal and vertical planes, respectively. The weight of a FOUP 170 is transferred through the Short Cross-Sectional Axis 160 of Horizontal Belt 130 onto Circular Surfaces 120, as is shown in FIG. 1B. Because Horizontal Belt 130 is flexible in the Short Cross-Sectional Axis 160 in which the weight of FOUP 170 is applied and is not continuously supported by Horizontal Rollers 110, the level of Horizontal Belt 130 varies between Horizontal Rollers 110. This unevenness limits the speed at which FOUP 170 can be conveyed while staying within vibration limits.

Another problem with existing transport systems used in the semiconductor wafer manufacturing industry is the difficulty of changing or turning the direction of conveyance of an article, such as a FOUP, without momentarily stopping its motion.

There are, therefore, needs for improved systems and methods for conveying articles in manufacturing facilities.

SUMMARY OF THE INVENTION

The present invention includes, in various embodiments, a transport system for moving articles along a conveyance path that includes straight, curvilinear, horizontal, inclined and/or declined sections. The articles are conveyed between essentially vertical rollers that have circular surfaces that rotate to provide motion in a conveyance direction. Vertically-oriented belts are optionally disposed between the vertical rollers and the articles. In some embodiments, the vertical belts include a long cross-sectional axis approximately parallel to the vertical plane and a short cross-sectional axis approximately perpendicular to an axis of rotation of the vertical rollers. The weight of the articles transported is supported in a direction parallel to the vertical axis. As such, the weight is directed approximately parallel to a vertical rotational axis of the vertical rollers and need not be supported by the circular surfaces of the vertical rollers. This configuration allows the weight of the articles to be decoupled from the uneven circular surfaces.

In those embodiments including vertical belts, the weight of articles transported is optionally further supported through the long cross-sectional axis of the vertical belts. For example, the vertical belts are optionally stiffer through the weight bearing long cross-sectional axis than they are through their short cross-sectional axis. This results in less variation in the height of the vertical belt between support points (e.g., rollers), as compared to the height of a horizontal belt of the prior art. Systems of the invention, therefore, typically included reduced unevenness in the conveyance path relative to the prior art. In various embodiments, this reduced unevenness allows articles, such as FOUPs including semiconductor wafers, to be transported at greater speeds than in the prior art while still staying within vibration limits.

In various embodiments, articles are supported between first and second vertical belts by one or more support protrusions extending from the first vertical belt and second vertical belt. The weight of the articles is transferred through the support protrusions to the vertical belt. In various embodiments, the support protrusions, vertical belts, and vertical rollers are configured to selectively engage and disengage the articles.

In some embodiments, the support protrusions are specifically configured to support FOUPs used to transport semiconductor wafers within semiconductor fabrication facilities.

A transport system optionally includes several transport sections each including separate vertical belts and/or separate sets of vertical rollers. Within an individual transport section, the vertical rollers are optionally configured in a curvilinear path, allowing an article to remain in motion as it is conveyed along a curved conveyance path. Further, within an individual transport section, the vertical rollers are optionally configured in an inclined or declined path, allowing the height of the article to be changed. In embodiments not including vertical belts, articles are typically transported by direct contact with vertical rollers.

Various embodiments of the invention include a system comprising a first belt and a second belt disposed on either side of a conveyance path and configured to convey an article along the conveyance path, a plurality of vertical rollers configured to guide the first belt and the second belt, and a plurality of support protrusions extending from the first belt and from the second belt, the plurality of support protrusions configured to support a weight of the article.

Various embodiments of the invention include a transport belt comprising a first surface configured to be coupled to a vertical roller, the vertical roller being configured to drive the transport belt in a conveyance path, a support protrusion configured to support the weight of an article being conveyed along the conveyance path by the transport belt, and a compliant material configured to allow the support protrusion to move in response to forces from the article, and thus allow the transport belt to operate as a shock absorber.

Various embodiments of the invention include a method comprising loading an article on a conveyance section, the conveyance section including a first belt and a second belt and a plurality of vertical rollers configured to guide the first vertical belt and the second vertical belt, conveying the article along a conveyance path using the first vertical belt and the second vertical belt, and unloading the article.

BRIEF DESCRIPTION OF THE DRAWINGS

For a more complete understanding of the present invention and for further features and advantages, reference is made to the following description taken in conjunction with the accompanying drawings, in which:

FIGS. 6A and 6B illustrate embodiments of a transport system in two different dynamically interchangeable states, according to various embodiments of the invention;

FIGS. 7A, 7B, 7C and 7D illustrate cross-sectional views of a vertical belt in different dynamically interchangeable states, according to various embodiments of the invention;

FIGS. 8A and 8B illustrate transport sections in which a first vertical belt and second vertical belt are moved apart in order to load or unload an article, according to various embodiments of the invention;

DETAILED DESCRIPTION OF THE INVENTION

Figures 1A, 1B:
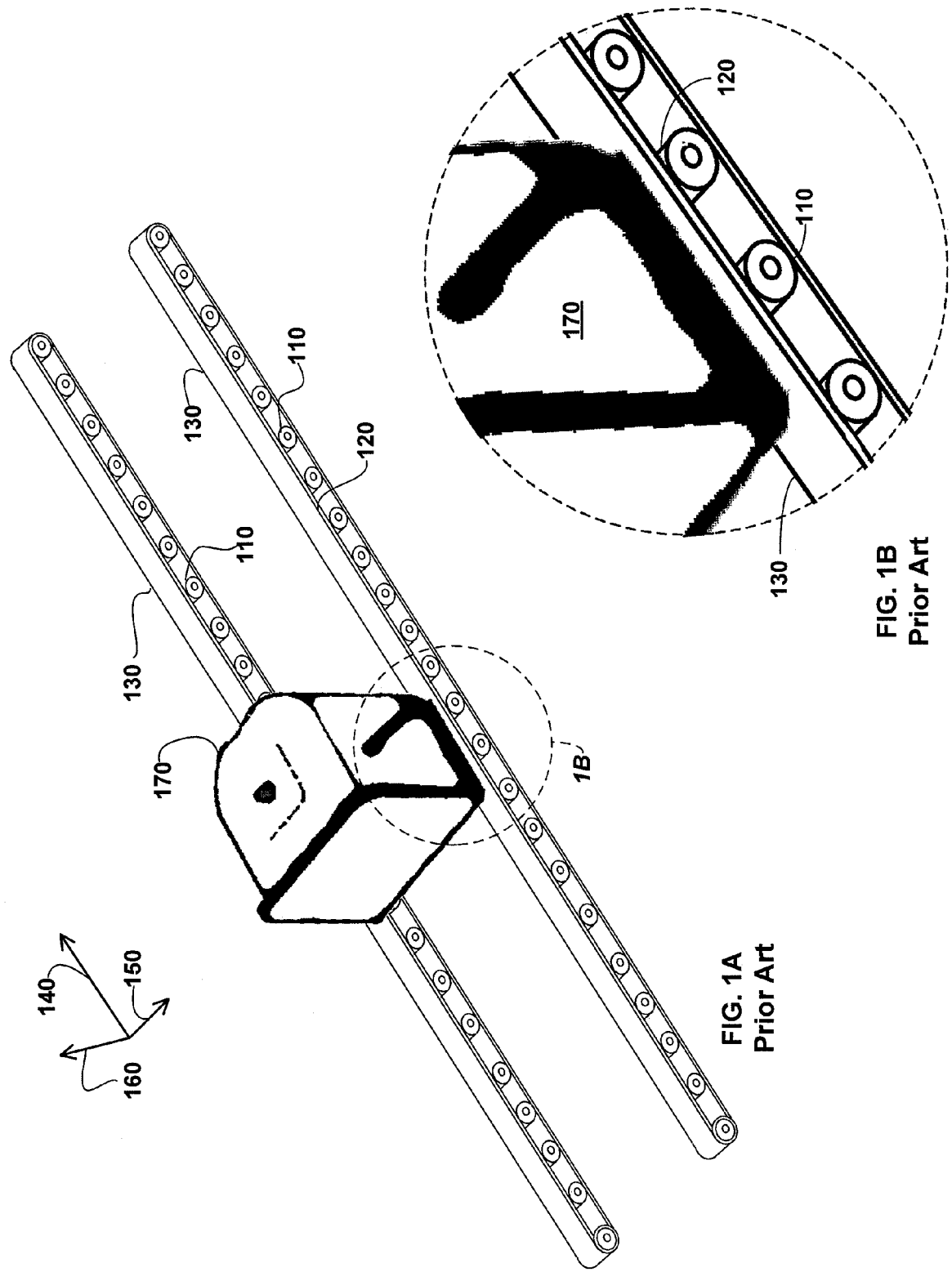
FIG. 1A is a perspective view of a prior art transport system.
FIG. 1B is a portion of FIG. 1A, enlarged for magnification purposes.

Various embodiments of the invention include improved systems and methods for automatically transporting articles such as FOUPs. For example, some embodiments include the use of vertical rollers to propel articles in a conveyance direction. In comparison with the prior art, the use of vertical rollers allows for more even support of articles and, thus, improved vibration management. In various embodiments, the use of vertical rollers allows the transport of articles along straight, inclined, declined, curvilinear (e.g., curved), and/or dynamically changing conveyance paths.

Vertical belts (transport belts) are optionally disposed between the vertical rollers and articles to be transported. In some embodiments, the vertical belts are configured to support the weight of the articles through a long vertical cross-sectional axis, as opposed to a short cross-sectional axis as in the prior art. By supporting the weight through the long cross-sectional axis, a more rigid, and thus more even, support can be provided as compared to systems in which support is provided through the short cross-sectional axis. In some embodiments, this more even support is used to transport articles at greater speeds than with prior art systems, while staying within vibration limits. In some embodiments, the vertical belts include a compliant material configured to reduce vibration of articles during transport.

In various embodiments, articles are supported by protrusions extending approximately horizontally from the vertical belts. In these embodiments, the weight of articles is transferred from the support protrusions through a long cross-sectional axis of a vertical belt. The support protrusions are optionally configured for supporting specific types of articles. For example, some embodiments include support protrusions configured for supporting a FOUP. The size and spacing of the support protrusions is optionally configured such that more than one protrusion from each vertical belt provides support to an article. In some instances, the support protrusions include a low friction material such as Teflon™ that will allow an article to move slightly on the support protrusions. In some embodiments, the support protrusions include a high friction material that reduces slippage during high acceleration and/or deceleration.

In various embodiments, the vertical belts include a compliant material configured to flex, deform, bend or otherwise change shape when an article is placed on the support protrusions. This compliant material may have shock absorbing properties and may act to reduce the effects of irregularity of the surfaces of the article being conveyed. For example, in some embodiments the compliant materials are configured to allow a support protrusion to move vertically when supporting the weight of a FOUP.

In various embodiments, the vertical belts are supported by a low friction sliding surface, an array of finely spaced horizontal rollers, a support lip of a vertical roller, or the like. In some embodiments, the vertical belts are configured to fit partially within a v-groove or notch within a vertical roller and are supported by surfaces within this v-groove or notch.

Some embodiments include a retaining lip configured to restrain movement of articles relative to the transport system. This retaining lip may be part of a support protrusion, be a separate protrusion coupled to a vertical belt, or be attached to a stationary supporting structure. The retaining lip is optionally configured to restrain a FOUP and, thus, prevent tipping during acceleration and deceleration.

Conveyance paths determined by the location of vertical rollers and/or vertical belts may be straight, curvilinear, inclined, declined, and/or dynamically variable. For example, in some embodiments, vertical rollers are coupled to movable mounts and are configured to move between various different positions in order to change a conveyance path. In some embodiments, vertical rollers are configured to move while conveying articles.

Figures 2A, 2B:
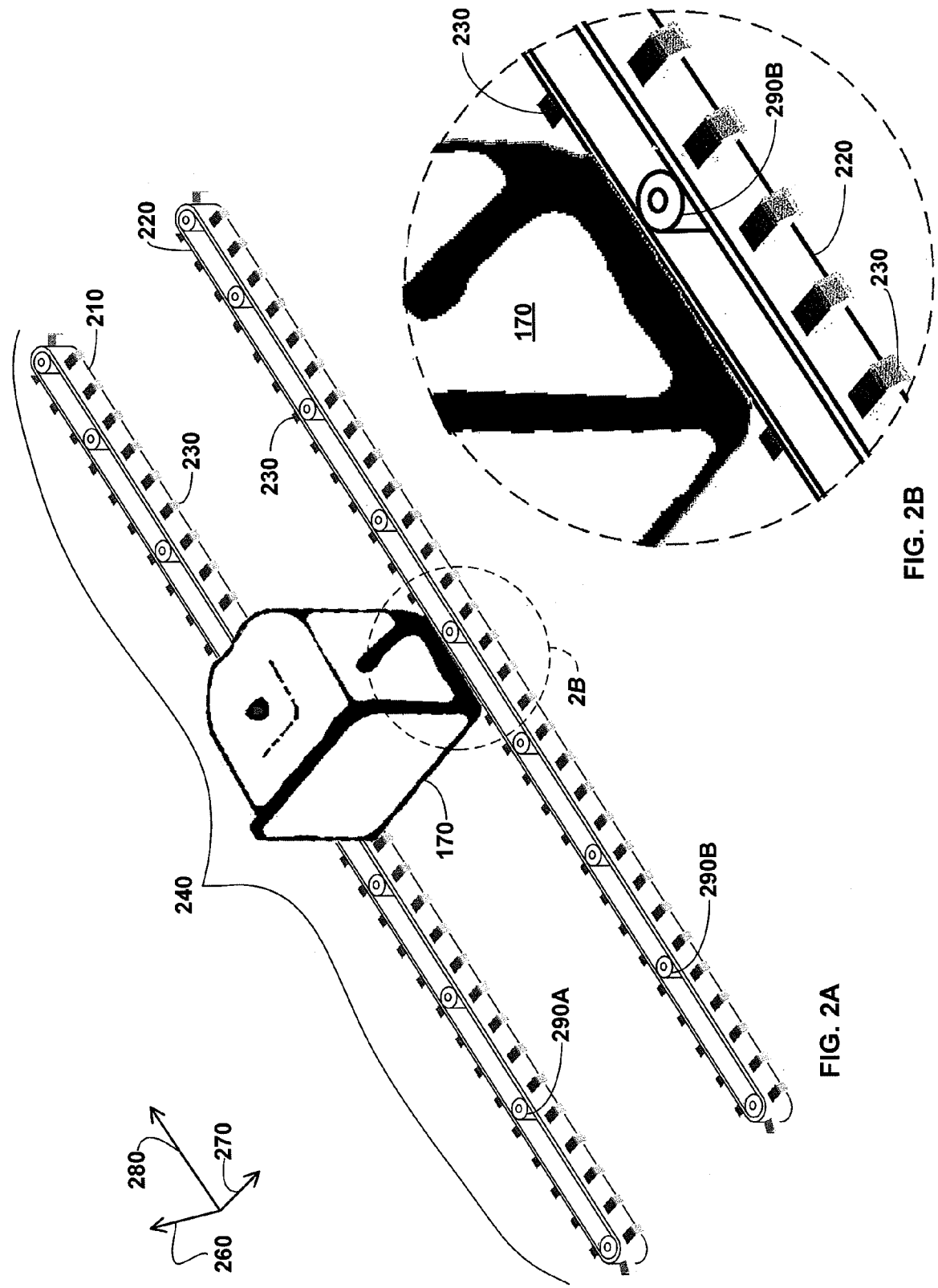
FIG. 2A illustrates a transport section including a vertical belt, according to various embodiments of the invention.
FIG. 2B is a portion of FIG. 2A, enlarged for magnification purposes.

FIG. 2A illustrates a Transport Section generally designated 240 and including a First Vertical Belt 210, a Second Vertical Belt 220, and optional Support Protrusions 230. Transport Section 240 is configured to convey an article such as FOUP 170 and may be configured with multiple instances of separate Transport Sections 240. First Vertical Belt 210 and Second Vertical Belt 220 are optional in some embodiments.

First Vertical Belt 210 and Second Vertical Belt 220 optionally include a material that is stiff along a Vertical Axis 260 and less stiff in a Horizontal Axis 270. Vertical Axis 260 is parallel to a long cross-sectional axis of First Vertical Belt 210 and Horizontal Axis 270 is parallel to a short cross-sectional axis of First Vertical Belt 210. The long cross-sectional axis and short cross-sectional axis are perpendicular to a length of First Vertical Belt 210, which is, in turn, parallel to a Conveyance Direction 280. In typical embodiments, the weight of FOUP 170 is supported in the direction of Vertical Axis 260 and, thus, through the stiffer long cross-sectional axis of First Vertical Belt 210.

First Vertical Belt 210 and Second Vertical Belt 220 are each driven separately or jointly in the Conveyance Direction 280 by a plurality of Vertical Rollers 290A and a plurality of Vertical Rollers 290B, respectively. Vertical Rollers 290A are spaced apart from Vertical Rollers 290B such that FOUP 170 may be supported between that First Vertical Belt 210 and Second Vertical Belt 220. The paths along which Vertical Rollers 290A and Vertical Rollers 290B are disposed define a conveyance path through which FOUP 170 will travel. Through selective placement of Vertical Rollers 290A and Vertical Rollers 290B, straight or curvilinear conveyance paths may be defined. Using a variety of transport sections, such as a multiplicity of Transport Section 240, a FOUP 170 can be transported along a complex variety of conveyance paths. Typically, at each end of a transport section, First Vertical Belt 210 and Second Vertical Belt 220 wrap around an instance of Vertical Rollers 290A and Vertical Rollers 290B, respectively. This is possible because First Vertical Belt 210 and Second Vertical Belt 220 are flexible in Horizontal Axis 270.

In typical embodiments, one or more Support Protrusions 230 are attached to each of First Vertical Belt 210 and to Second Vertical Belt 220. Support Protrusions 230 extend from First Vertical Belt 210 and from Second Vertical Belt 220, and are optionally configured such that the weight of conveyed articles is supported through the long cross-sectional axes of First Vertical Belt 210 and Second Vertical Belt 220. FIG. 2B is a portion of FIG. 2A, enlarged to show further detail of FOUP 170, Second Vertical Belt 220, Support Protrusions 230 and one of Vertical Rollers 290B. As First Vertical Belt 210 and Second Vertical Belt 220 are driven (moved) by Vertical Rollers 290A and Vertical Rollers 290B, articles resting on Support Protrusions 230 are carried along Transport Section 240 in Conveyance Direction 280.

Figure 2C:
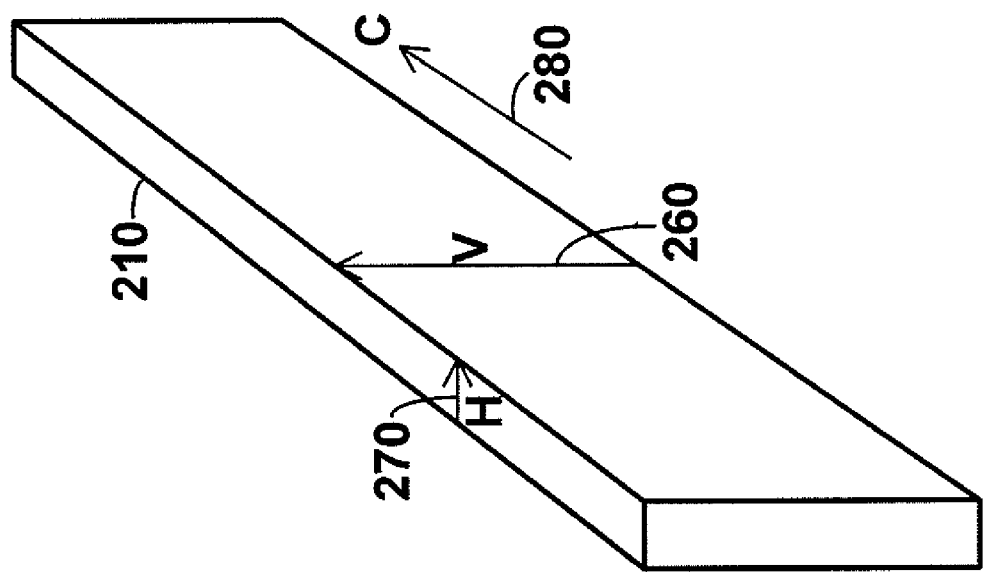
FIG. 2C illustrates the orientation of a vertical belt with respect to horizontal and vertical axes.

FIG. 2C illustrates, in further detail, the relationship between First Vertical Belt 210 and Vertical Axis 260, Horizontal Axis 270, and Conveyance Direction 280.

Figure 3:
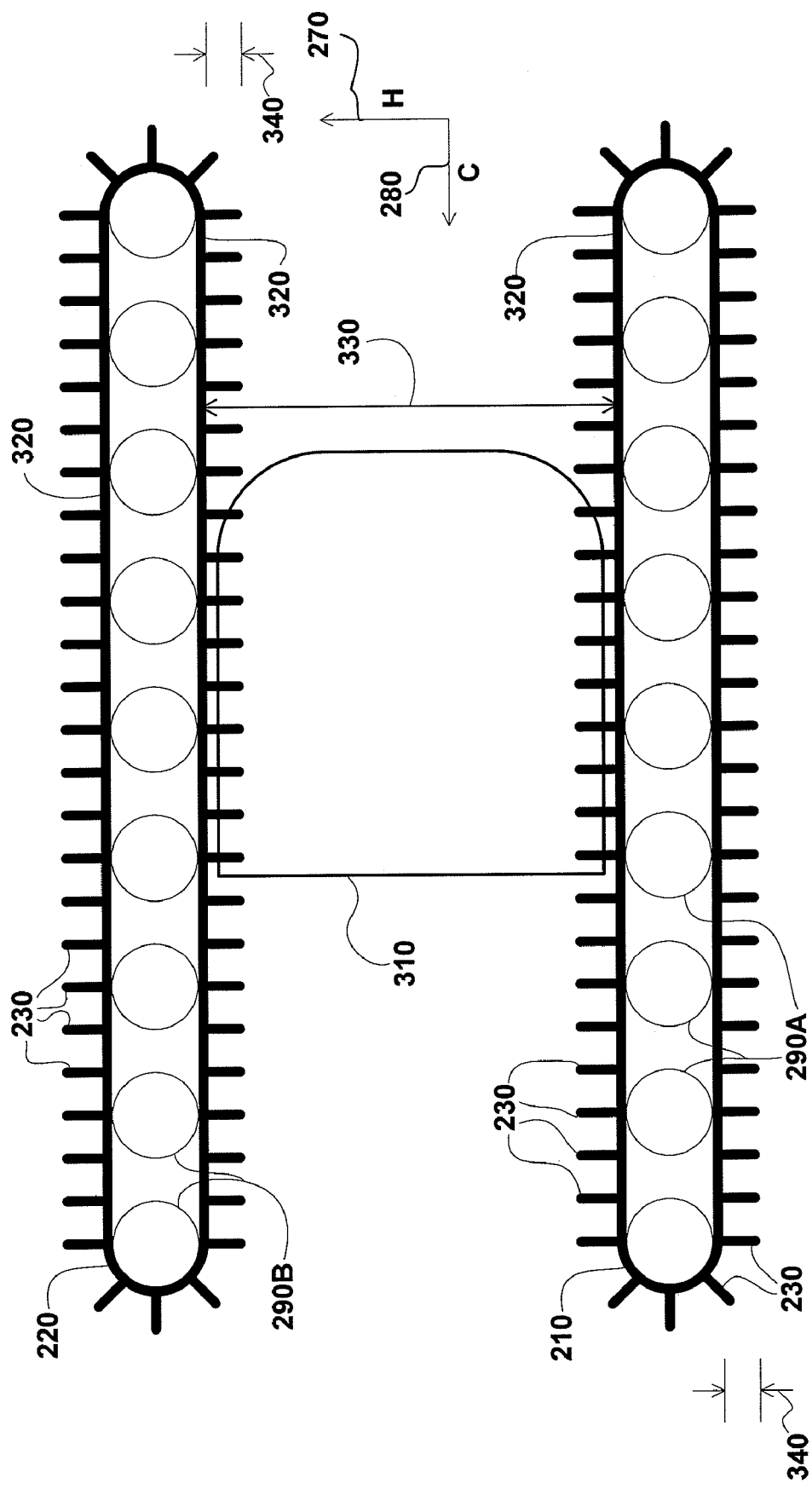
FIG. 3 illustrates a top view of the transport section of FIG. 2A, according to various embodiments of the invention.

FIG. 3 illustrates a top view of Transport Section 240. This view illustrates how FOUP 170, illustrated by Outline 310, is laterally confined (in Horizontal Axis 270) by First Vertical Belt 210 and Second Vertical Belt 220, and Vertical Rollers 290A and Vertical Rollers 290B. In various embodiments, Vertical Surfaces 320 of First Vertical Belt 210 and Second Vertical Belt 220 are separated by a Distance 330 equal to or less than 390, 415, or 500 millimeter (mm). Thus, an instance of FOUP 170 that is, for example, 390 mm wide has less than zero, 25, or 110 mm of lateral freedom of movement, or greater than zero, 25, or 110 mm of lateral freedom of movement. Some embodiments of the invention include a three-point kinematic interface (not shown) configured for locating a FOUP within this freedom of movement when the FOUP is unloaded from Transport Section 240.

FIG. 3 also illustrates how FOUP 170, illustrated by Outline 310, rests on Support Protrusions 230. In various embodiments, Support Protrusions 230 extend a Distance 340 equal to or less than 10, 50, or 100 mm from Vertical Surfaces 320. In various embodiments, Support Protrusions 230 extend under FOUP 170 by distances equal to or greater than 10, 50, or 100 mm.

Support Protrusions 230 attached to First Vertical Belt 210 may be separated from each other by a variety of distances. For example, in instances of Transport Section 240 configured to transport FOUP 170 along a straight conveyance path, Support Protrusions 230 may be further apart than in an instance of Transport Section 240 configured to transport FOUP 170 in a curvilinear conveyance path. In various embodiments, instances of Support Protrusions 230 attached to First Vertical Belt 210 are disposed equal to or less than 10, 30, or 100 mm from each other. In one embodiment, Support Protrusions 230 are in contact with each other. In this embodiment, Support Protrusions 230 form an essentially continuous support.

FIGS. 4A, 4B, 4C and 4D illustrate cross-sectional views of alternative embodiments of First Vertical Belt 210, Support Protrusions 230 and Vertical Rollers 290A. It will be appreciated from the embodiments illustrated herein that many variations from the illustrated embodiments of First Vertical Belt 210, Support Protrusion 230 and Vertical Rollers 290A-290B are within the scope of this disclosure. In addition, Second Vertical Belt 220 and Vertical Rollers 290B are optionally configured identically to First Vertical Belt 210 and Vertical Rollers 290A.

Figure 4A:
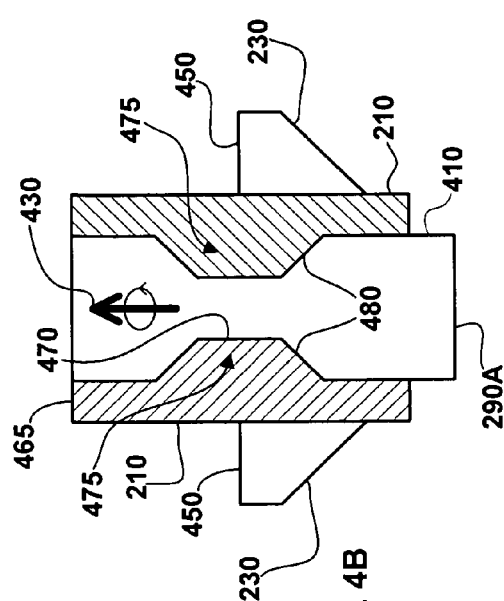
FIGS. 4A, 4B, 4C and 4D illustrate cross-sectional views of a vertical belt and a vertical roller, according to various alternative embodiments of the invention.

FIG. 4A illustrates an instance of Vertical Rollers 290A including a Circular Surface 410 and a Support Surface 420. This instance of Vertical Rollers 290A is configured to rotate around a Vertical Rotational Axis 430 and to support First Vertical Belt 210 on Support Surface 420. Support Surface 420 is optionally tapered downward or upward toward an Outside Edge 440 of Vertical Rollers 290A, and optionally comprised of a low friction material such as Teflon™. Support Surface 420 carries the weight of First Vertical Belt 210 and, through Support Protrusions 230, the weight of FOUP 170. Vertical Rollers 290A may be configured to support First Vertical Belt 210 on two sides, as illustrated in FIG. 4A, or on a single side. For example, if different instances of Vertical Rollers 290A are used to support First Vertical Belt 210 as it returns in its looping path, then only one side of an instance of Vertical Rollers 290A may be used to support First Vertical Belt 210.

In typical embodiments, Support Protrusions 230 are configured for a FOUP 170 to rest on a Support Surface 450. Support Surface 450 is optionally curved in directions perpendicular and/or parallel to Vertical Surfaces 320. Support Surface 450 optionally includes a low friction coating (not shown). In some embodiments, Support Surface 450 is disposed a Distance 460 below an Upper Edge 465 of First Vertical Belt 210. As such, part of an article transported may be below part of First Vertical Belt 210. In various embodiments, Distance 460 is equal to or greater than zero, 10, 20, or 50 mm.

Figure 4C:
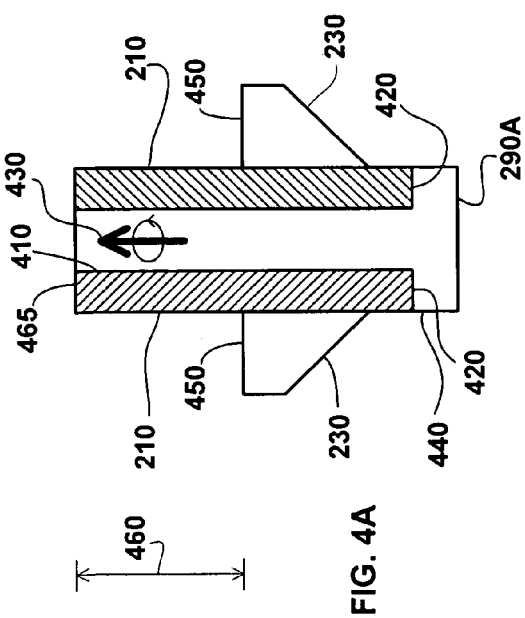
Figure 4B:
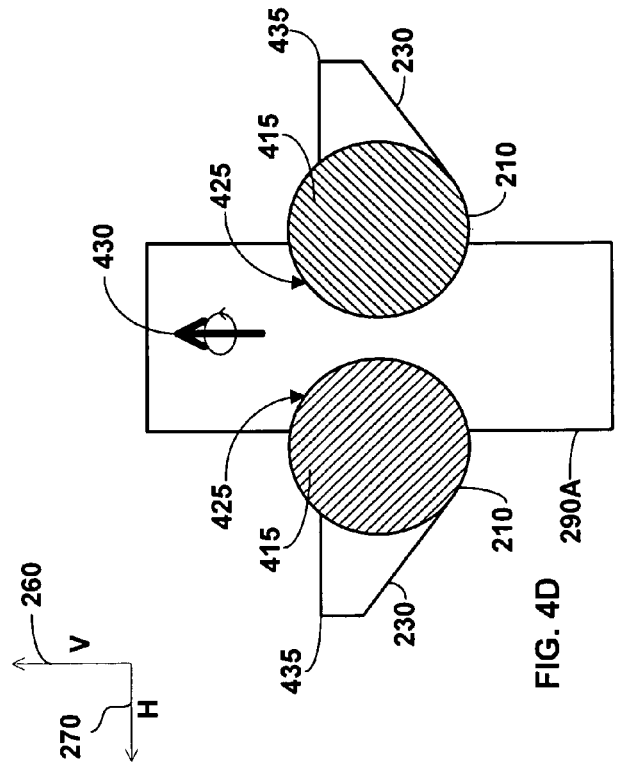

FIG. 4B illustrates a cross-sectional view of alternative embodiments of First Vertical Belt 210 and a member of Vertical Rollers 290A. In these embodiments, Vertical Rollers 290A include a notch or groove, such as a V-Groove 470, configured to receive a Part 475 of First Vertical Belt 210.

V-Groove 470 includes a combined Circular/Support Surface 480 configured to support First Vertical Belt 210. In these embodiments, Support Surface 420 may not be required.

FIG. 4C illustrates a cross-sectional view of an alternative embodiment of First Vertical Belt 210 and Vertical Rollers 290A. These embodiments include an optional Capture Lip 485 and a Support 490. Typically, Capture Lip 485 is optionally included in other embodiments, such as those illustrated by FIGS. 4A and 4B. Capture Lip 485 is attached to First Vertical Belt 210 and is configured to restrict the vertical movement of FOUP 170. Capture Lip 485 is optionally connected to Support Protrusions 230. In alternative embodiments, Capture Lip 485 is attached to a separate, optionally stationary, support (not shown).

Support 490 is configured to support the weight of FOUP 170 through First Vertical Belt 210. In some embodiments, Support 490 includes a stationary low friction surface on which First Vertical Belt 210 is configured to slide. In some embodiments, Support 490 includes rolling elements such as ball bearings, or horizontally disposed rollers (not shown). These horizontally disposed rollers are optionally smaller and more closely spaced than Vertical Rollers 290A.

Figure 4D:
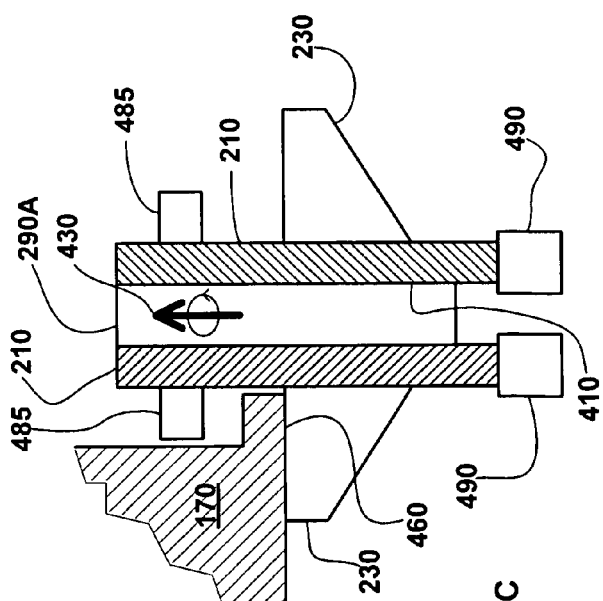

FIG. 4D illustrates a cross-sectional view of a Belt 415 and a member of Vertical Roller 290A. Belt 415 is an alternative embodiment of Vertical Belt 210. In these embodiments, Belt 415 has a rounded (e.g., circular or elliptical) cross-section and Vertical Rollers 290A includes a Groove 425 configured to receive Belt 415. Because Belt 415 is round, long and short cross-sectional axes are not apparent. However, when Belt 415 is placed on Vertical Rollers 290A, Belt 415 still has vertical and horizontal axes that can be defined relative to the vertical and horizontal planes of the cross-section.

Belt 415, as well as First Vertical Belt 210 and Second Vertical Belts 220, optionally include a compliant material configured to reduce vibrations of an article being transported. In various embodiments, this compliant material can include urethane with a durometer hardness ranging between 25A and 75D, silicone, PVC (polyvinyl chloride), rubber or the like. The compliant material reduces vibration by, for example, allowing vertical movement of an Edge 435 of Support Protrusions 230 distal to Belt 415. This movement may occur when an article is loaded or unloaded from Belt 415, when the force (e.g., weight) of an article on Support Surface 450 changes, or when Belt 415 is disposed in a curvilinear, inclined or declined path. For example, if there is unevenness in the height of Belt 415 the force of an article on Support Surface 450 may change as an article is transported. In this instance, movement of Edge 435 or Support Surface 450 absorbs some of this change in force and Belt 415 acts as a shock absorber.

First Vertical Belt 210 and Second Vertical Belt 220 are optionally configured to reduce vibrations in a manner similar to that of Belt 415. For example, referring to FIG. 4A, First Vertical Belt 210 may include a compliant material that is configured to allow Upper Edge 465 to move away from First Vertical Rollers 290A when a FOUP 170 is loaded onto First Vertical Belt 210. This movement results in a movement of Support Surface 450. As FOUP 170 is transported, forces that may cause vibration may be absorbed by First Vertical Belt 210. The freedom of movement available to Upper Edge 465 allows First Vertical Belt 210 to act as a shock absorber.

Figure 5:
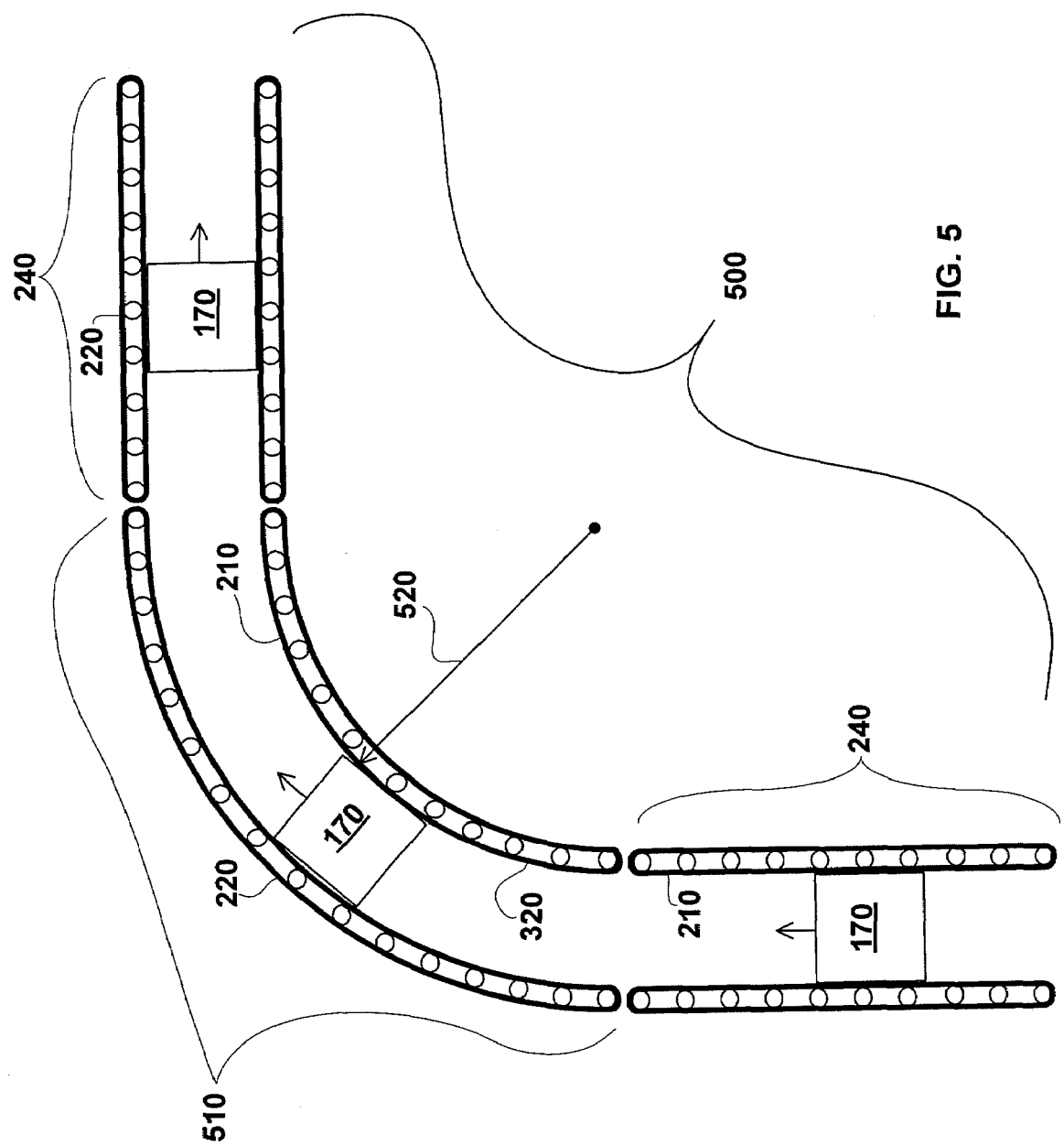
FIG. 5 illustrates an embodiment of a transport system including a transport section configured to form a curvilinear conveyance path, according to various embodiments of the invention.

FIG. 5 illustrates an embodiment of Transport System 500 including a Transport Section 510 configured to form a curvilinear conveyance path. Transport Section 510 is optionally an embodiment of Transport Section 240. In various embodiments, an inner Vertical Surface 320 of First Vertical Belt 210 of Transport Section 510 is disposed in a Radius of Curvature 520 equal to, or less than, 2.0, 1.5 or 1.0 meters. In some embodiments, Transport Section 510 is banked. This may allow tighter radii of curvature. Within Transport Section 510, First Vertical Belt 210 is typically configured to run at a different speed than Second Vertical Belt 220. For example, in one embodiment, First Vertical Belt 210 is configured to move at a slower linear velocity than Second Vertical Belt 220. Thus, Transport Section 510 may include belts and rollers that run at different speeds while transporting FOUP 170.

Using Transport Section 510, FOUP 170 can be turned without slowing or without momentarily stopping. Thus, the direction of motion of FOUP 170 can be changed without slowing or without stopping. Further, more than one instance of FOUP 170 can be turned by Transport Section 510 at the same time. By arranging several Transport Section 510 and Transport Section 240 together, a complex variety of curvilinear and straight conveyance paths can be configured. In some embodiments, Transport Section 510 and/or Transport Section 240 are configured to change the elevation of FOUP 170 above the ground as FOUP 170 moves along a conveyance path.

FIGS. 6A and 6B illustrate embodiments of Transport System 500 in two different dynamically interchangeable states. These embodiments include a Dynamic Transport Section 610 configured to change shape and, thus, convey FOUP 170 along alternative conveyance paths. FIG. 6A illustrates a first state in which Dynamic Transport Section 610 is disposed to convey FOUP 170 along a linear conveyance path from a first instance of Transport Section 240 to a second instance of Transport Section 240. FIG. 6B illustrates a second state in which Dynamic Transport Section 610 is disposed to convey FOUP 170 along a curvilinear conveyance path from the first instance of Transport Section 240 to a third instance of Transport Section 240. The transition between the first state and the second state may be performed automatically and is optionally performed while Dynamic Transport Section 610 is being used to transport FOUP 170. Thus, the change in state can be performed without stopping the transport of FOUP 170.

As shown in FIGS. 6A and 6B, the length of Dynamic Transport Section 610 can be different in the first state and the second state. Dynamic Transport Section 610 optionally includes one or more Tension Rollers 620 configured to maintain tension of First Vertical Belt 210 and Second Vertical Belt 220 as Dynamic Transport Section 610 changes length from the first state to the second state. Tension Rollers 620 are typically an embodiment of Vertical Rollers 290A. The change in shape of Dynamic Transport Section 610 shown in FIGS. 6A and 6B is possible, in part, because the required motion is in the Horizontal Axis 270 where First Vertical Belt 210 and Second Vertical Belt 220 are less stiff.

The change of Dynamic Transport Section 610 from the first state to the second state optionally includes concerted motion of Tension Rollers 620 and various instances of vertical rollers. For example, the state change may include the movement in the horizontal plane of Vertical Rollers 290C and 290D. If the movement occurs during transport of FOUP 170, the spacing between Vertical Rollers 290C and 290D may be appropriately maintained during movement. Likewise, the spacing between Vertical Rollers 290E and 290F may be appropriately maintained as they are moved to new positions. In order to create the curvilinear path illustrated in FIG. 6B, Vertical Rollers 290E and 290F are move a greater distance than Vertical Rollers 290C and 290D from their original position in FIG. 6A. Typically, movement of Vertical Rollers 290A-290F are managed by a computer controlled translation system (not shown). Vertical Rollers 290A-290F are embodiments of Vertical Rollers 290A and 290B.

While FIGS. 6A and 6B illustrate the conveyance of instances of FOUP 170 from right to left, alternative embodiments may be configured for conveyance from left to right. Thus, Dynamic Transport Section 610 may be used to direct FOUP 170 to a selected member of a plurality of alternative destinations, or to receive FOUP 170 from a selected member of a plurality of alternative sources.

In some embodiments, Dynamic Transport Section 610 is configured to reorder the instances of FOUP 170 within Transport System 500. For example, Dynamic Transport Section 610 may be used to shift a front first FOUP 170 from a primary conveyance path to a secondary conveyance path that allows the first FOUP 170 to be passed by a second FOUP 170. The first FOUP 170 is then returned to the primary conveyance path using a second instance of Dynamic Transport Section 610 behind the second FOUP 170. This exchange of position can be performed while continuously moving both the first FOUP 170 and the second FOUP 170.

Transport Section 240 and Dynamic Transport Section 610 optionally include mechanisms configured to facilitate loading or unloading of FOUP 170. These mechanisms include, for example, a region in which Capture Lip 485 is absent, a region in which Capture Lip 485 is moved, a region in which First Vertical Belt 210 is bent or tilted, or a region in which First Vertical Belt 210 and/or Second Vertical Belt 220 are moved apart.

FIGS. 7A and 7B illustrate embodiments in which First Vertical Belt 210 is bent in Vertical Axis 260 in order to facilitate loading and/or unloading of FOUP 170. FIG. 7A illustrates First Vertical Belt 210 in a loading/unloading position. In this position, an Upper End 725 of First Vertical Belt 210 is bent toward Vertical Rotational Axis 430 of a Vertical Roller 710. Vertical Roller 710 is an embodiment of Vertical Roller 290A or 290B and is optionally convexly shaped in order to promote the bending of First Vertical Belt 210. When First Vertical Belt 210 is bent as illustrated in FIG. 7A, FOUP 170 is separated from a Capture Element 730.

Capture Element 730 is configured to apply pressure against a side of FOUP 170 in order to hold FOUP 170 securely between First Vertical Belt 210 and Second Vertical Belt 220. Capture Element 730 is typically a compliant material such as urethane. When Capture Element 730 is separated from FOUP 170, FOUP 170 can be loaded or unloaded from Transport System 500.

FIG. 7B illustrates First Vertical Belt 210 in a transport position. In this position, First Vertical Belt 210 is held straight by a Vertical Roller 720 and Capture Element 730 is applied to an edge of FOUP 170. Vertical Roller 710 and Vertical Roller 720 are optionally included in the same instance of Transport Section 240. Thus, First Vertical Belt 210 may be bent at some points within Transport Section 240 and be held straight at other points within Transport Section 240. Those points at which First Vertical Belt 210 is bent may be used for loading or unloading, while FOUP 170 is held securely between First Vertical Belt 210 and Second Vertical Belt 220 at those points at which First Vertical Belt 210 (and Second Vertical Belt 220) are held straight.

FIGS. 7C and 7D illustrate embodiments in which Vertical Rollers 290A and 290B are tilted in Vertical Axis 260 in order to facilitate loading and unloading of FOUP 170. FIG. 7C illustrates First Vertical Belt 210 and Vertical Roller 290A in a transport position, while FIG. 7D illustrates First Vertical Belt 210 and Vertical Roller 290A in a load/unload position. In the load/unload position, Vertical Roller 290A and Vertical Rotational Axis 430 is tilted relative to Horizontal Axis 270. This tilting shifts Capture Element 730 away from FOUP 170 and allows loading or unloading of FOUP 170. Tilting of Vertical Roller 290A or 290B is controlled by a mechanical or electromechanical Tilt Control Element 740. Typically, both Vertical Rollers 290A and Vertical Rollers 290B are tilted as illustrate in FIG. 7D in order to load or unload FOUP 170. These tilts are optionally in opposing directions.

While those embodiments illustrated by FIGS. 7A-7D include the use of Capture Element 730, in alternative embodiments, Capture Element 730 is replaced by Capture Lip 485. As with Capture Element 730, Capture Lip 485 is configured to limit movement of FOUP 170, e.g., preventing FOUP 170 from inadvertently disengaging from Transport Section 240. However, Capture Lip 485 is configured to limit primarily vertical movement and need not make physical contact with FOUP 170 during normal transport.

FIGS. 8A and 8B illustrate embodiments of Transport Sections 240 and 850 in which First Vertical Belt 210 and Second Vertical Belt 220 are moved apart in order to load or unload FOUP 170. FIG. 8A illustrates Transport Sections 240 and 850 in a normal transport mode used for conveying FOUP 170. In this mode, First Vertical Belt 210 and Second Vertical Belt 220 of Transport Section 850 are approximately a uniform Distance 810 from each other.

FIG. 8B illustrates Transport Sections 240 and 850 in a load/unload mode in which Vertical Rollers 830A and Vertical Rollers 830B and, thus, First Vertical Belt 210 and Second Vertical Belt 220 have been moved apart in Transport Section 850. Vertical Rollers 830A and 830B are embodiments of Vertical Rollers 290A and 290B, respectively. In the load/unload mode all or part of those instances of First Vertical Belt 210 and Second Vertical Belt 220 are a Distance 820 from each other. Distance 820 is typically greater than Distance 810. Distance 820 is sufficient to disengage Capture Element 730 from FOUP 170 or to allow FOUP 170 to clear Capture Lip 485. However, Distance 820 is optionally not so large that FOUP 170 is no longer supported by Support Protrusions 230. In various embodiments, Vertical Rollers 830A and 830B are disposed toward one end of Transport Section 850 or disposed elsewhere within Transport Section 850. Vertical Rollers 830A and 830B are moved from the positions shown in FIG. 8A to the positions shown in FIG. 8B by a mechanical or electromechanical control element.

Figure 9:
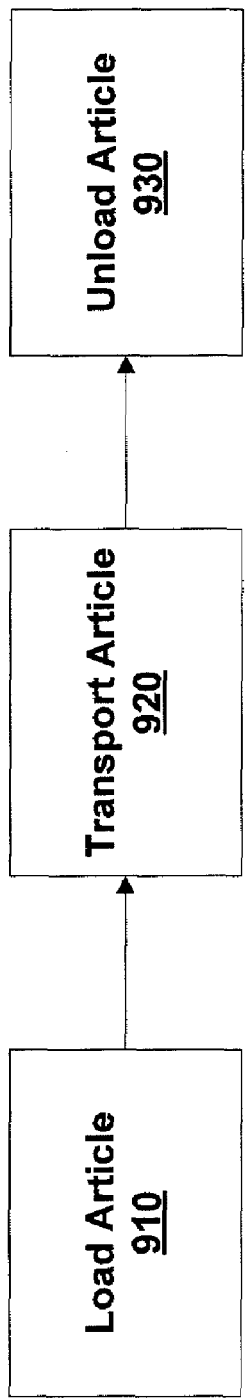
FIG. 9 illustrates methods of conveying articles, according to various embodiments of the invention.

FIG. 9 illustrates methods of conveying articles, according to various embodiments. In these methods, an article is loaded onto a transport system such as those describe elsewhere herein, transported and unloaded. In a Load Article Step 910, articles to be conveyed are placed on a transport section such as Transport Sections 240 or 850. The articles are optionally placed at a section of Transport Section 240 specifically configured for loading and unloading articles. For example, a FOUP 170 including semiconductor wafers may be loaded at a loading point discussed in relation to FIG. 7A-7D, 8A or 8B. The transport section on which articles are placed includes Vertical Rollers 290A and 290B, and optionally First Vertical Belt 210 and Second Vertical Belt 220. The weight of the placed article is not necessarily supported by Circular Surface 410, or Vertical Rollers 290A or 290B. The weight of the placed article is, therefore, optionally decoupled from Vertical Rollers 290A and 290B.

In a Transport Article Step 920, the article loaded in Load Article Step 910 is conveyed in a conveyance direction using Vertical Rollers 290A and 290B. This conveyance is optionally performed at a greater speed and/or a lower vibration rate than is possible in systems of the prior art. Transport Article Step 920 optionally includes directing the article along a curvilinear path such as that illustrated in FIG. 5. The curvilinear path is optionally traversed without slowing or without momentarily stopping the article.

In an Unload Article Step 930, the article is removed from the transport system. This removal optionally occurs at a location configured for loading and/or unloading of the article, as discussed elsewhere herein. Load Article Step 910 and/or Unload Article Step 930 optionally include changing the shape of First Vertical Belt 210 as illustrated in FIGS. 7A and 7B, tilting Vertical Rollers 290A or 290B as illustrated in FIGS. 7C and 7D, or moving Vertical Rollers 290A and 290B apart as illustrated in FIGS. 8A and 8B.

Figure 10:
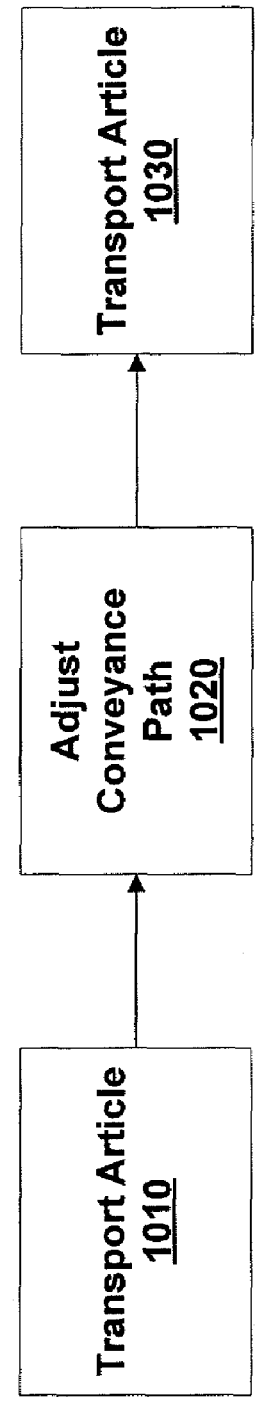
FIG. 10 illustrates methods of dynamically changing a conveyance path, according to various embodiments of the invention.

FIG. 10 illustrates methods of dynamically changing a conveyance path, according to various embodiments of the invention. The methods illustrated in FIG. 10 are optionally performed using the systems illustrated in FIGS. 6A and 6B during Transport Article Step 920 (FIG. 9).

In a Transport Article Step 1010, an article, such as FOUP 170, is transported as in Transport Article Step 920. In an Adjust Conveyance Path Step 1020, a conveyance path for the article is changed by moving Vertical Rollers 290A or 290B. This movement may be in the horizontal or vertical plane. In some embodiments, a Tension Roller 620 is used to adjust tension of a vertical belt coupled to Vertical Rollers 290A or 290B. The tension adjustment may be made before, during or after moving Vertical Rollers 290A or 290B. In some embodiments, the movement of Vertical Rollers 290A or 290B is performed while these rollers are conveying a FOUP. In a Transport Article Step 1030, the article is again conveyed, as in Transport Article Step 920 or Transport Article Step 1010.

Several embodiments are specifically illustrated and/or described herein. However, it will be appreciated that modifications and variations are covered by the above teachings and within the scope of the appended claims without departing from the spirit and intended scope thereof. For example, while the transportation of FOUPs in semiconductor manufacturing have been used herein as an illustrative example, systems and methods of the invention may be configured for transporting alternative materials, such as for example, substrates for the manufacture of liquid crystal, organic light emitting diode or other types of display devices. Further, the vertical rollers and vertical belts discussed herein need not be perfectly vertical. The spacing of vertical rollers as illustrated herein is for illustrative purposes only. In various embodiments, vertical rollers may be disposed in a wide variety of spacings, from closely packed to widely dispersed including a single roller or rollers located only at each end of a belt.

The embodiments discussed herein are illustrative of the present invention. As these embodiments of the present invention are described with reference to illustrations, various modifications or adaptations of the methods and or specific structures described may become apparent to those skilled in the art. All such modifications, adaptations, or variations that rely upon the teachings of the present invention, and through which these teachings have advanced the art, are considered to be within the spirit and scope of the present invention. Hence, these descriptions and drawings should not be considered in a limiting sense, as it is understood that the present invention is in no way limited to only the embodiments illustrated.

What is claimed is:

1. A system comprising:
    a first belt and a second belt disposed on either side of a conveyance path and configured to convey an article along the conveyance path;
    at least three approximately vertical rollers configured to guide the first belt;
    at least three approximately vertical rollers configured to guide the second belt; and
    a plurality of support protrusions extending from the first belt and from the second belt, the plurality of support protrusions configured to support a weight of the article, the article having a lateral freedom of movement of less than 25 millimeters between the first belt and the second belt.

2. The system of claim 1, further including the article, the article including a Front Opening Unified Pod (FOUP).

3. The system of claim 1, further including the article, the article including a semiconductor wafer.

4. The system of claim 1, further including the article, the article including a substrate used for manufacturing a display device.

5. The system of claim 1, wherein the first belt and the second belt are a first vertical belt and a second vertical belt respectively.

6. The system of claim 1, wherein the first belt and the second belt include a compliant material configured to allow movement of a member of the plurality of support protrusions responsive to the weight of the article.

7. The system of claim 1, wherein the first belt and the second belt are configured to move at speeds different from each other.

8. The system of claim 1, wherein the plurality of vertical rollers are disposed such that the conveyance path is curvilinear.

9. The system of claim 1, wherein the plurality of vertical rollers are configured to move in order to change the conveyance path.

10. The system of claim 1, wherein a member of the plurality of support protrusions includes an article supporting surface that is disposed below a part of the first belt.

11. A system comprising:
    a first belt and a second belt disposed on either side of a conveyance path and configured to convey an article along the conveyance path;
    at least three approximately vertical rollers configured to guide the first belt;
    at least three approximately vertical rollers configured to guide the second belt; and
    a plurality of support protrusions extending from the first belt and from the second belt, the plurality of support protrusions configured to support a weight of the article, the first belt and the second belt being at least 415 millimeters apart.

12. The system of claim 1, wherein the plurality of vertical rollers are configured to move horizontally in order to change the conveyance path of the article.

13. A system comprising:
    a first belt and a second belt disposed on either side of a conveyance path and configured to convey an article along the conveyance path;
    at least three approximately vertical rollers configured to guide the first belt;
    at least three approximately vertical rollers configured to guide the second belt; and
    a plurality of support protrusions extending from the first belt and from the second belt, the plurality of support protrusions configured to support a weight of the article, the first belt and the second belt being disposed less than 500 millimeters apart.

14. The system of claim 1, wherein the conveyance path is inclined or declined.

15. The system of claim 11, further including the article, the article including a Front Opening Unified Pod (FOUP).

16. The system of claim 11, further including the article, the article including a semiconductor wafer.

17. The system of claim 11, further including the article, the article including a substrate used for manufacturing a display device.

18. The system of claim 11, wherein the first belt and the second belt are a first vertical belt and a second vertical belt respectively.

19. The system of claim 11, wherein the first belt and second belt include a compliant material configured to allow movement of a member of the plurality of support protrusions responsive to the weight of the article.

20. The system of claim 11, wherein the first belt and second belt are configured to move at speeds different from each other.

21. The system of claim 11, wherein the plurality of vertical rollers are disposed such that the conveyance path is curvilinear.

22. The system of claim 11, wherein the plurality of vertical rollers are configured to move in order to change the conveyance path.

23. The system of claim 11, wherein a member of the plurality of support protrusions includes an article supporting surface that is disposed below a part of the first belt.

24. The system of claim 11, wherein the plurality of vertical rollers are configured to move horizontally in order to change the conveyance path of the article.

25. The system of claim 11, wherein the conveyance path is inclined or declined.

26. The system of claim 13, further including the article, the article including a Front Opening Unified Pod (FOUP).

27. The system of claim 13, further including the article, the article including a semiconductor wafer.

28. The system of claim 13, further including the article, the article including a substrate used for manufacturing a display device.

29. The system of claim 13, wherein the first belt and the second belt are a first vertical belt and a second vertical belt respectively.

30. The system of claim 13, wherein the first belt and the second belt include a compliant material configured to allow movement of a member of the plurality of support protrusions responsive to the weight of the article.

31. The system of claim 13, wherein the first belt and the second belt are configured to move at speeds different from each other.

32. The system of claim 13, wherein the plurality of vertical rollers are disposed such that the conveyance path is curvilinear.

33. The system of claim 13, wherein the plurality of vertical rollers are configured to move in order to change the conveyance path.

34. The system of claim 13, wherein a member of the plurality of support protrusions includes an article supporting surface that is disposed below a part of the first belt.

35. The system of claim 13, wherein the plurality of vertical rollers are configured to move horizontally in order to change the conveyance path of the article.

36. The system of claim 13, wherein the conveyance path is inclined or declined.

* * * * *